(12) United States Patent
Sakakura et al.

(10) Patent No.: US 6,268,235 B1
(45) Date of Patent: Jul. 31, 2001

(54) METHOD FOR MANUFACTURING A PHOTOELECTRIC CONVERSION DEVICE

(75) Inventors: Masayuki Sakakura; Yasuyuki Arai, both of Kanagawa; Shunpei Yamazaki, Tokyo, all of (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/235,126

(22) Filed: Jan. 21, 1999

(30) Foreign Application Priority Data

Jan. 27, 1998 (JP) .................................... 10-029282

(51) Int. Cl.[7] .................................... H01L 21/00
(52) U.S. Cl. .................................... 438/62
(58) Field of Search .................. 438/57, 61, 62, 438/96, 484, 485, 490, 491, 507, 508, 509, 907, 913; 136/244, 245, 252, 258, 261

(56) References Cited

U.S. PATENT DOCUMENTS 4,492,605 * 1/1985 Ishihara et al. ........................ 438/61
4,519,339 * 5/1985 Izu et al. ............................... 118/718
4,624,862 * 11/1986 Yang et al. ............................. 427/74

* cited by examiner

*Primary Examiner*—Keith Christianson
(74) *Attorney, Agent, or Firm*—Fish & Richardson P.C.

(57) ABSTRACT

In a method of manufacturing a photoelectric conversion device, a step of forming a microcrystalline semiconductor film and a step of implanting an impurity element into the microcrystalline semiconductor film are separated from each other so that the productivity of the photoelectric conversion device by a roll-to-roll system manufacturing apparatus is increased. In the method, first, a first electrode is formed on an organic resin substrate. Then a first microcrystalline semiconductor film, a substantially intrinsic amorphous semiconductor film, and a second microcrystalline semiconductor film are continuously formed by a roll-to-roll system plasma CVD method. The first and second microcrystalline semiconductor films are formed without adding n-type or p-type conductivity determining impurity elements. After the formation of the films, a p-type conductivity determining impurity element is implanted into the second microcrystalline semiconductor film. By carrying out a heat treatment, the p-type conductivity determining impurity element is activated so that a p-type microcrystalline semiconductor film is obtained, and at the same time, an n-type microcrystalline semiconductor film having lowered resistance can be obtained.

36 Claims, 4 Drawing Sheets

METHOD FOR MANUFACTURING A PHOTOELECTRIC CONVERSION DEVICE

BACKGROUND OF THE INVENTION

1. Field of the Invention

The present invention relates to a method for manufacturing a photoelectric conversion device, typified by a solar cell or an image input sensor, which uses roll-to-roll system production means, and to a roll-to-roll system apparatus for manufacturing the photoelectric conversion device.

2. Description of the Related Art

As compared with a crystalline silicon material, an amorphous silicon film has such features that a film with a large area can be formed at a low temperature not higher than 400° C., and a thickness of about 1 $\mu$m is sufficient for the film as a photoelectric conversion layer to absorb light. Thus, the amorphous silicon film presents saving of silicon resources and lowering of manufacturing energy, and has hitherto attracted attention as a low cost material.

In a conventional technique, it has been common that a photoelectric conversion layer of a solar battery, an image sensor, a photosensor, or the like uses a diode structure in which a PIN junction is formed, so as to raise a photoelectric conversion efficiency or light responsibility. Although it is possible to form all of p-type and n-type semiconductor films and a substantially intrinsic i-type semiconductor film from amorphous silicon films, it is known that if a microcrystalline silicon material is used for the p-type and n-type semiconductor films, excellent photoelectric conversion characteristics can be obtained.

The reason is that in the photoelectric conversion layer of the PIN junction structure, since light absorption and generation of electric charges due to the light absorption occur in the i-type amorphous silicon film, the p-type and n-type semiconductor films are required to have high light transmissivity and to have such high conductivity that an excellent contact with an electrode can be achieved. For such requirements, the microcrystalline silicon film has properties of both low light absorption and high conductivity, so that it is a material suitable for the p-type layer and the n-type layer of the photoelectric conversion layer.

The amorphous silicon film is formed by a chemical deposition method (plasma CVD method) using a glow discharge plasma under a reduced pressure. The plasma CVD method uses a plasma CVD apparatus including a reaction chamber, exhaust means for keeping the reaction chamber under a reduced pressure, gas introduction means for introducing a raw material gas, means for generating a glow discharge plasma in the reaction chamber, and means for holding and heating a substrate. Although a silane ($SiH_4$) gas is generally used as a raw material gas of an amorphous silicon film, it is also possible to use a disilane ($Si_2H_6$) gas. Further, it is also possible to use a gas obtained by diluting the foregoing raw material gas with a hydrogen ($H_2$) gas.

On the other hand, as a raw material gas of a microcrystalline silicon film, a mixture gas of a $SiH_4$ gas and a $H_2$ gas is used, and the film can be obtained when film formation is carried out under such a state that a diluting ratio of the $H_2$ gas to the $SiH_4$ gas has been raised. It is known that a microcrystalline silicon film itself to which a p-type or n-type conductivity determining impurity element is not added, shows n-type conductivity. However, in general, in order to control its conductivity of p-type or n-type and to raise its electrical conductivity, an impurity gas containing a p-type or n-type conductivity determining impurity element is added to the raw material gas and the film is manufactured.

In a technical field of semiconductor, an element of group III of the periodic table, typified by boron (B), aluminum (Al), gallium (Ga), and indium (In) is known as the p-type conductivity determining impurity element, and an element of group Vb of the periodic table, typified by phosphorus (P), arsenic (As), and antimony (Sb) is known as the n-type conductivity determining impurity element. In a general plasma CVD method, an impurity gas typified by $B_2H_6$ or $PH_3$ is mixed to the raw material gas and a film is formed. The addition amount of the mixed impurity gas at this time is about 0.1% to 5% of $SiH_4$, and is not higher than 10% at most.

As described above, since the process temperature of the microcrystalline silicon film or amorphous silicon film is low, an organic resin film in addition to a glass material can be used as a substrate of a photoelectric conversion device. Since the thickness of several tens to several hundreds $\mu$m suffices for the organic resin substrate and the organic resin film has flexibility, a roll-to-roll system production means can be applied. The roll-to-roll system can be applied to any step of the photoelectric conversion device, and it can be applied to a laser scribing step and a printing step for patterning, in addition to a step of forming an electrode by a sputtering method and a step of forming a photoelectric conversion layer by a plasma CVD method.

Basic steps relating to a photoelectric conversion layer of a solar battery, an image sensor, or the like manufactured on a substrate include a step of forming a first electrode on the substrate, a step of forming a photoelectric conversion layer which is made of a PIN junction and is in close contact with the first electrode, and a step of forming a second electrode which is in close contact with the photoelectric conversion layer. At the time of manufacturing the PIN junction which becomes the photoelectric conversion layer, the film formation is generally carried out without breaking a vacuum so as to improve the characteristics of a contact interface.

It is known that at this time, when the foregoing impurity gas is added to the foregoing raw material gas in order to form a p-type or n-type semiconductor film, a very small amount of impurity gas and its reaction product remain and are attached to a reaction chamber and a discharge electrode as a part of glow discharge plasma producing means.

For example, after the formation of an n-type silicon film, when a substantially intrinsic i-type amorphous silicon film is formed continuously in the same reaction chamber without adding an impurity gas, there has been a problem that the remaining impurity separates from the n-type silicon film and is newly taken in the i-type film. Since the substantially intrinsic i-type amorphous silicon film is manufactured such that the defect density in the film is made not higher than about $1\times10^{16}/cm^3$, there has been a problem that even if the impurity element with a concentration of several tens ppm to several hundreds ppm is taken in, an impurity level is generated so that the characteristics of the film is changed.

In order to solve such problems, a multi-chamber separation type plasma CVD apparatus in which a plurality of reaction chambers are provided and gas separation means are provided between the respective reaction chambers, is put to practical use. In order to form the PIN junction, it has been necessary to provide at least three independent reaction chambers to form p-type, i-type and n-type semiconductor films.

Although the roll-to-roll system has a merit that productivity is excellent through a continuous process of an elongate substrate, various contrivances have been necessary to solve the foregoing problems in the plasma CVD apparatus.

FIG. 2 is a schematic view of a conventional plasma CVD apparatus for a solar battery by a roll-to-roll system. An elongate substrate 212 wound on a bobbin 205 is disposed in a feeding chamber 210. The elongate substrate 212 fed from this chamber is rewound on a rewinding bobbin 206 provided in a rewinding chamber 211 through a coupling slit 209a, an n-type film forming chamber 201a, a coupling slit 209b, an i-type film forming chamber 201b, a coupling slit 209c, a p-type film forming chamber 201c, and a coupling slit 209d. At this time, the coupling slits 209a to 209d have functions to enable continuous movement of the elongate substrate 212 while a reduced pressure state is maintained between the respective film forming chambers 201a to 201c, and to prevent raw material gases and impurity gases supplied to the respective film forming chambers from diffusing and mixing with each other.

In order to make the elongate substrate smoothly pass through the coupling slit, the coupling slit with a wide cross section and a firm substrate supporting mechanism are required, while in order to prevent gases from mixing with each other, a narrow slit cross section and a mechanism for supporting and transferring the substrate without damaging the surface of a formed film are required. However, it has been very difficult to satisfy such inconsistent requirements. Especially, in the case where an organic resin film having flexibility is used, since the substrate itself is apt to deform, even if the coupling slit is precisely worked, the surface of a formed film has been often damaged.

Further, like other plasma CVD apparatuses, in the roll-to-roll system plasma CVD apparatus, it is necessary to at least provide gas introduction means 208 for introducing a $SiH_4$ gas, an $H_2$ gas, a $B_2H_6$ gas, or a $PH_3$ gas, exhaust means 202a to 202e, glow discharge plasma generating means 203a to 203c, and substrate heating means 204a to 204c, correspondingly to the respective reaction chambers, so that the structure of the apparatus has become complicated and large-scale. Thus, much labor has been required also in view of maintenance of the apparatus.

SUMMARY OF THE INVENTION

In order to solve the foregoing problems, the present invention has features in a method for forming a photoelectric conversion layer in which a step of forming an amorphous semiconductor layer and a microcrystalline semiconductor layer is separated from a step of controlling conductivity by adding an impurity to the microcrystalline semiconductor layer.

That is, according to the present invention, in manufacturing steps of a photoelectric conversion layer, for the purpose of increasing the productivity, a step of forming a first microcrystalline semiconductor film which is formed without adding p-type and n-type conductivity determining impurity elements, a step of forming a substantially intrinsic amorphous semiconductor film, and a step of forming a second microcrystalline semiconductor film which is formed without adding p-type and n-type conductivity determining impurity elements are sequentially carried out from a first electrode side. Thereafter, a p-type conductivity determining impurity element is implanted into the second microcrystalline semiconductor film.

Alternatively, the step of implanting the p-type conductivity determining impurity element may be carried out in such a manner that after a second electrode to be in close contact with the second microcrystalline semiconductor film is formed, the p-type conductivity determining impurity element is implanted into the second microcrystalline semiconductor film through the surface of the second electrode. The p-type impurity element may be implanted into the second microcrystalline silicon film and also into the vicinity of an interface between the second microcrystalline silicon film and the substantially intrinsic amorphous silicon film.

The present invention has features that, with respect to the first and second microcrystalline semiconductor films which are formed without adding p-type and n-type conductivity determining impurity elements in order to prevent pollution due to an impurity gas in a plasma CVD method, a heat treatment is applied to the first microcrystalline semiconductor film and to the second microcrystalline semiconductor film into which the p-type conductivity determining impurity element was implanted, to increase the conductivity of the respective films, so that microcrystalline semiconductor films having n-type and p-type conductivities are obtained and the photoelectric conversion layer is manufactured.

According to the present invention, as compared with a conventional step of forming p-type and n-type microcrystalline semiconductor films, it becomes unnecessary to add p-type and n-type conductivity determining impurity elements. This means that in the step of forming the p-type and n-type microcrystalline semiconductor films and the substantially intrinsic i-type amorphous semiconductor film, it is not necessary to take degradation due to the impurity into consideration. Besides, the microcrystalline semiconductor films constituting the p-type and n-type semiconductor films and the substantially intrinsic amorphous silicon film can be made of the same reactive gas, specifically, only a reaction gas of a $SiH_4$ gas or $Si_2H_6$ gas and an $H_2$ gas.

Moreover, according to the present invention, in the step of forming the p-type and n-type microcrystalline semiconductor films and the substantially intrinsic i-type amorphous semiconductor film, it is not necessary to introduce the impurity gas, which means that one reactive chamber suffices for the step, and in the roll-to-roll system plasma CVD apparatus, it is not necessary to provide a coupling slit which enables continuous movement of an elongate substrate between respective reaction chambers while maintaining a reduced pressure state, and which prevents raw material gases and impurity gases supplied to the respective reaction chambers from diffusing and mixing with each other. As a result, it is not necessary to provide a plurality of exhausting means, glow discharge plasma generating means, and substrate heating means, so that the structure of the plasma CVD apparatus can be simplified.

Thus, the semiconductor films constituting the photoelectric conversion layer can be formed by the same glow discharge plasma producing means provided in the same reaction chamber. Alternatively, a plurality of glow discharge plasma producing means are provided along the feeding direction of the elongate substrate in one reaction chamber, so that film formation can be made by using the different plasma producing means for each layer.

DETAILED DESCRIPTION OF THE INVENTION

Figure 1:
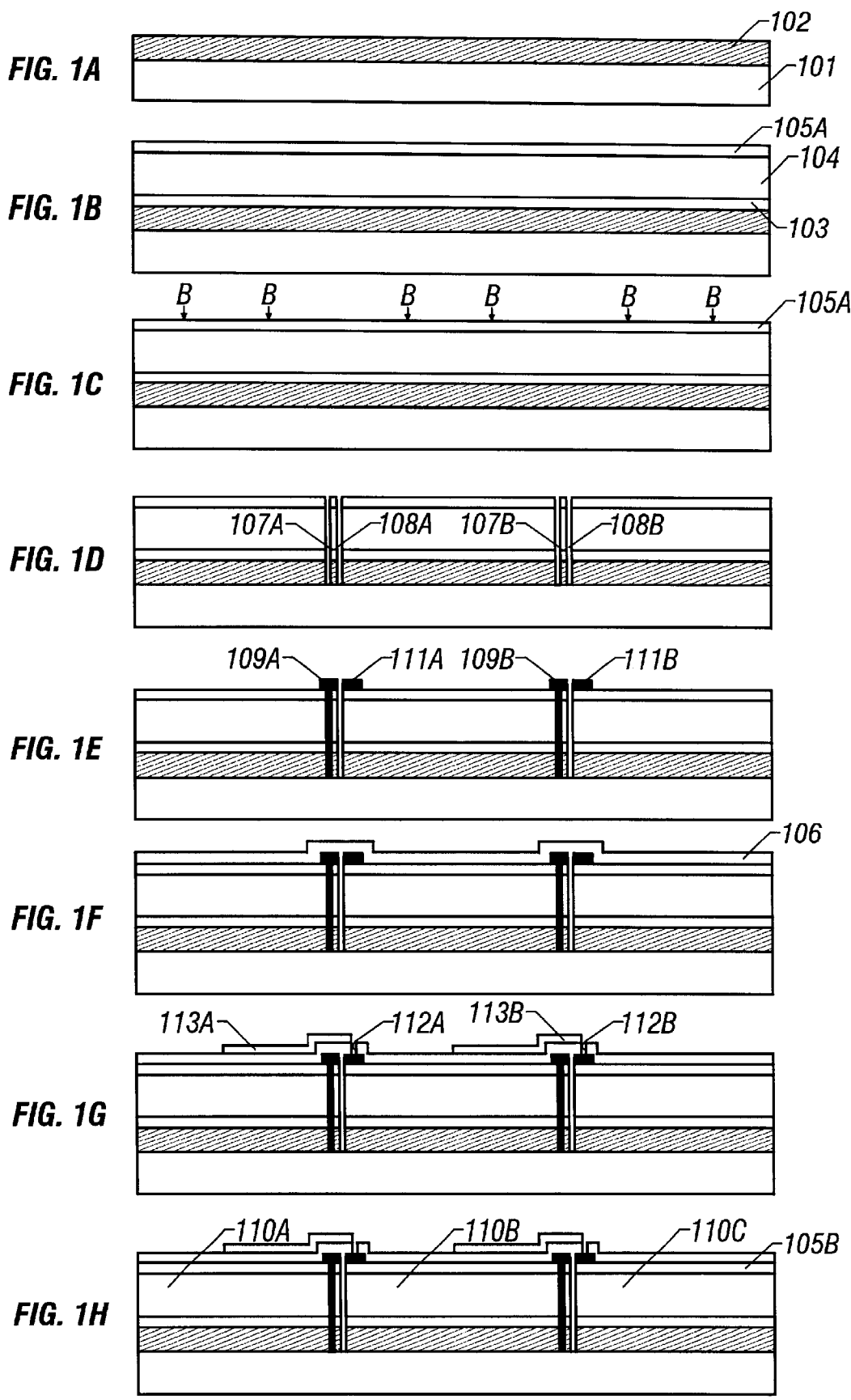
FIGS. 1A to 1H are schematic views showing an example of a method for manufacturing a photoelectric conversion device according to the present invention.
Figure 2:
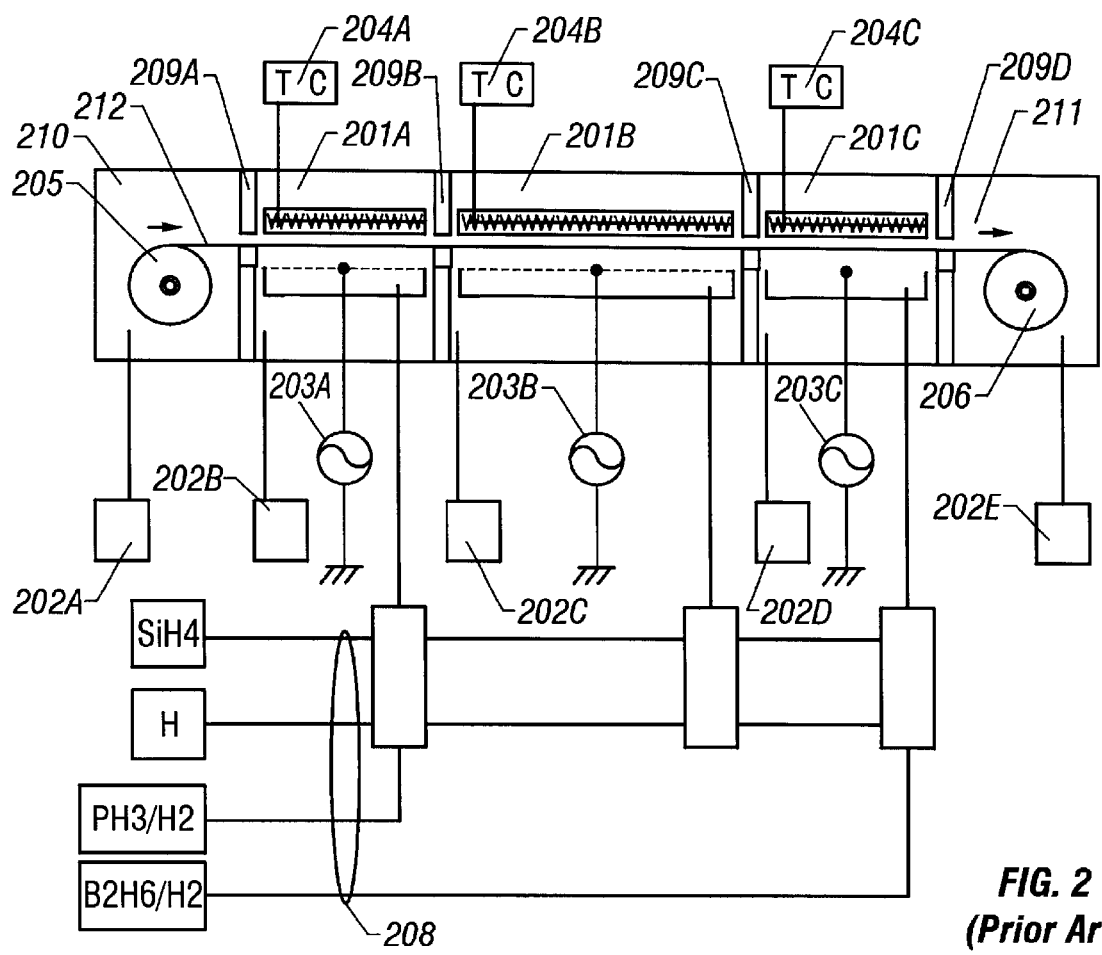
FIG. 2 is a schematic view showing a conventional roll-to-roll system plasma CVD apparatus.

Manufacturing steps according to the best mode of the present invention will be described with reference to FIGS. 1A to 1H. A photoelectric conversion layer is formed by using a first step of forming a first microcrystalline semiconductor film 103 to be in close contact with a first electrode 102, a second step of forming a substantially intrinsic amorphous semiconductor film 104 to be in close contact with the first microcrystalline semiconductor film 103, a third step of forming a second microcrystalline semiconductor film 105a to be in close contact with the amorphous semiconductor film 104 (the above steps are shown in FIG. 1B), a fourth step of implanting a p-type conductivity determining impurity element into the second microcrystalline semiconductor film 105a (FIG. 1C), and a fifth step of applying a heat treatment to the first and second microcrystalline semiconductor films and the substantially intrinsic amorphous semiconductor film (FIG. 1H).

The microcrystalline semiconductor film 103 showing n-type conductivity, the microcrystalline semiconductor film 105b showing p-type conductivity, and the substantially intrinsic amorphous semiconductor film 104 can be obtained through the foregoing steps, and the photoelectric conversion layer with a PIN junction can be formed.

Here, this first microcrystalline semiconductor film 103 forms an n-type conductive film of the photoelectric conversion layer, and the second microcrystalline semiconductor film 105a forms a p-type conductive film of the photoelectric conversion layer. In the step of forming the first microcrystalline semiconductor film 103, since p-type and n-type conductivity determining impurity elements are not added, the first microcrystalline semiconductor film 103 shows n-type conductivity, as is conventionally known. Thus, it is not necessary to add an n-type impurity element which is required in the prior art.

Like the first microcrystalline semiconductor film 103, since p-type and n-type conductivity determining impurity elements are not added to the second microcrystalline semiconductor film 105a at the film formation, the film shows n-type conductivity. However, a p-type conductivity determining impurity element is implanted in a subsequent step, so that p-type conductivity is given. Then heat treatment is applied to each of the first and second microcrystalline semiconductor films to activate the p-type conductivity determining impurity element, so that the conductivity of the second microcrystalline semiconductor film is raised and the p-type semiconductor film can be formed, and further, the conductivity of the first microcrystalline semiconductor film is also raised so that the n-type conductive film having high conductivity can be formed.

In this embodiment, since the first microcrystalline silicon film 103, the second microcrystalline silicon film 105a, and the substantially intrinsic amorphous silicon film 104 can be formed from the same reactive gas composed of a $SiH_4$ gas and an $H_2$ gas, it is not always necessary to change gases when the respective films are formed.

In the conventional roll-to-roll system plasma CVD apparatus, a plurality of reaction chambers are separated from each other by coupling slits. However, in this embodiment, when the semiconductor films constituting the photoelectric conversion layer are formed, since an impurity gas to determine the conductivity is not added, film forming gases are made the same gas so that the first microcrystalline silicon film 103, the second microcrystalline silicon film 105a, and the substantially intrinsic amorphous silicon film 104 can be continuously formed in the same reaction chamber.

Figure 3:
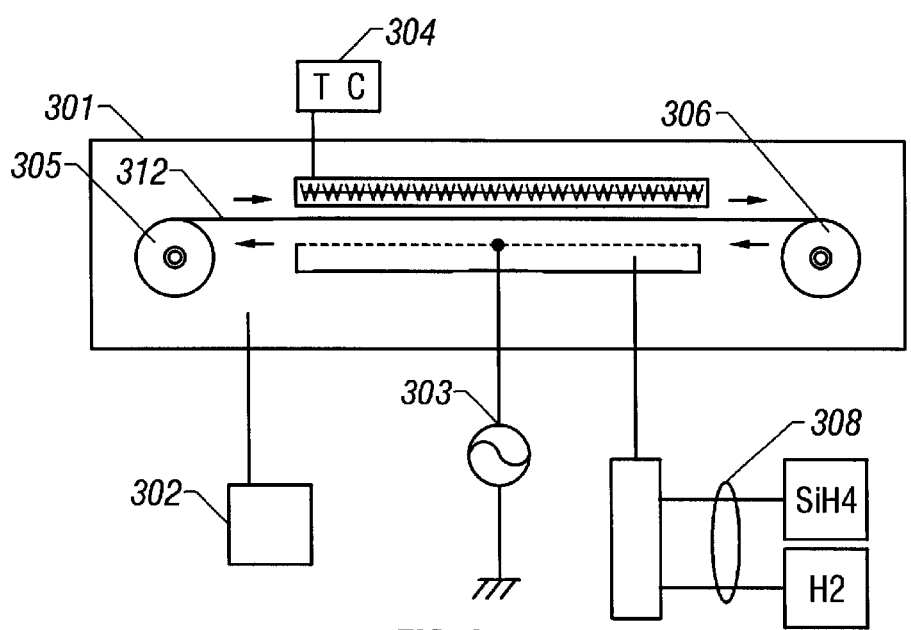
FIG. 3 is a schematic view showing a roll-to-roll system plasma CVD apparatus of the present invention.

FIG. 3 shows a roll-to-roll system plasma CVD apparatus for manufacturing a photoelectric conversion layer according to this mode of the present invention. As shown in FIG. 3, one glow discharge plasma producing means 303 is provided in one reaction chamber 301. An elongate substrate 312 is reciprocated, so that the first microcrystalline silicon film 103, the substantially intrinsic amorphous silicon film 104, and the second microcrystalline silicon film 105a are continuously formed by using the one glow discharge plasma generating means 303 and the three silicon films can be laminated on the substrate 312.

In the fourth step of implanting the p-type conductivity determining impurity element into the second microcrystalline semiconductor film 105a, if an ion doping method is used, the concentration distribution of the p-type impurity in the film thickness direction in the second microcrystalline semiconductor film 105a can be easily controlled by controlling an acceleration voltage. Particularly, in the case where the p-type conductivity determining impurity element is implanted from the surface of a second electrode, it is preferable to use the ion doping method to an ion implantation method in view of the control of the concentration distribution.

As the flexible elongate substrate, it is possible to use a substrate made of an organic resin material selected from the group consisting of polyethylene terephthalate, polyethylene naphthalate, polyether sulfone, polyimide, and aramid.

In the present invention, the best mode is that microcrystalline silicon films are used for the microcrystalline semiconductor films 103 and 105a, and an amorphous silicon film is used for the amorphous semiconductor film. As the amorphous semiconductor film 104, a film having constituents of plural kinds of elements selected from carbon, silicon, germanium, and tin, such as an amorphous silicon carbide film, an amorphous silicon germanium film, or an amorphous silicon tin film, can be used.

Although the present invention will be described below in more detail with reference to specific embodiments, the present invention is not limited to the following embodiments.

[Embodiment 1]

An embodiment of the present invention will be described in accordance with steps of manufacturing a solar battery shown in FIGS. 1A to 1H. In this embodiment, a substrate 101 having a thickness of 80 μm and made of polyethylene naphthalate (PEN) was used. As other available organic resin film materials, polyethylene terephthalate, polyether sulfone, polyimide, aramid, and the like can be enumerated. The substrate 101 is an elongate substrate wound on a bobbin into a roll, and the solar battery is manufactured by using a roll-to-roll system apparatus.

First, a first electrode 102 was formed on the surface of the elongate substrate 101. The first electrode 102 was formed by using a roll-to-roll system sputtering apparatus. The first electrode 102 was formed of a light reflective metallic electrode made of a material selected from Al, Ag, Ti, Cr, Ni, and Pt. As a required thickness, although it is sufficient if the electrode has a thickness of about 100 to 300 nm, even if the thickness is not within this range, it does not relate to the structure of the present invention. Here, the first electrode was formed in such a manner that an Al film with a thickness of 150 nm was formed by a sputtering method, and further, a Ti film with a thickness of 20 nm was formed by the sputtering method on the surface of the Al film (FIG. 1A).

Next, a step of forming microcrystalline silicon films and an amorphous silicon film, which became a photoelectric conversion layer, on the surface of the first electrode 102 was carried out. A first microcrystalline silicon film 103 without adding p-type and n-type conductivity determining impurity elements, a substantially intrinsic amorphous silicon film 104, and a second microcrystalline silicon film 105a without adding p-type and n-type conductivity determining impurity elements were formed by a roll-to-roll system plasma CVD method (FIG. 1B).

FIG. 3 is a schematic view of a roll-to-roll system plasma CVD apparatus used in this embodiment. In a reaction chamber 301, there are provided exhaust means 302, glow discharge plasma generating means 303, substrate heating means 304, and reaction gas supply means 308. The elongate substrate 312 is fed from a feeding bobbin 305, and is rewound on a rewinding bobbin 306. According to the method of this embodiment, since the first and second microcrystalline silicon films and the amorphous silicon film are made of a $SiH_4$ gas and an $H_2$ gas, it is not necessary to provide coupling slits which have been required in the conventional roll-to-roll system plasma CVD apparatus.

The film formation steps of this embodiment will be described with reference to FIGS. 1A to 1H and FIG. 3. The elongate substrate 312 was wound out of the feeding bobbin 305, the first microcrystalline silicon film 103 was formed on the surface of the elongate substrate 312, where the first electrode 102 had been formed, under the after-mentioned condition that a microcrystalline silicon film was able to be obtained, and the substrate was directly rewound on the rewinding bobbin 306. Next, the rewinding bobbin 306 was reversely rotated, so that the elongate substrate 312 was again introduced into the reaction chamber, and the substantially intrinsic amorphous silicon film 104 was formed on the first microcrystalline silicon film 103. The elongate substrate 312 was rewound by reversely rotating the feeding bobbin 305. With respect to the second microcrystalline silicon film 105a, similarly to the foregoing first microcrystalline silicon film 103, the elongate substrate 312 was wound out of the feeding bobbin 305, the second microcrystalline silicon film was formed on the substantially intrinsic amorphous silicon film 104, and the substrate was rewound on the rewinding bobbin 306.

In this step, the first microcrystalline silicon film 103 and the second microcrystalline silicon film 105a, which were formed without adding p-type and n-type conductivity determining impurity elements, were formed under the same condition. Specifically, the film formation was carried out under the condition that the flow of $SiH_4$ was 2 sccm, the flow of $H_2$ was 200 sccm, the pressure was kept at 133 Pa, and an RF (13.56 MHZ) power of 120 mW/cm$^2$ was applied. At this time, the temperature of the substrate was kept at 160° C.

With respect to a film formation condition of the microcrystalline silicon film, a basically well-known technique is used, and the condition is not limited to the above-mentioned film formation condition. As the range of applicable film formation condition, $SiH_4:H_2$=1:30 to 1:100, pressures are in the range of 5 to 266 Pa, RF power densities are in the range of 50 to 250 mW/cm$^2$, and substrate temperatures are in the range of 80 to 300° C. As to the deposition thickness, it is appropriate that the thicknesses of the first microcrystalline silicon film 103 are in the range of 10 to 80 nm, and the thicknesses of the second microcrystalline silicon film 105a are in the range of 5 to 50 nm. In this embodiment, the thickness of the first microcrystalline silicon film 103 was made 30 nm, and the thickness of the second microcrystalline silicon film 105a was made 25 nm.

The substantially intrinsic amorphous silicon film 104 was formed under the condition that the flow of $SiH_4$ was 40 sccm, the flow of $H_2$ was 360 sccm, the pressure was kept at 133 Pa, and an RF (13.56 MHZ) power of 48 mW/cm$^2$ was applied. At this time, the temperature of the substrate was kept at 160° C.

With respect to a film formation condition of the amorphous silicon film, a basically well-known technique is used, and the condition is not limited to the above-mentioned film formation condition. As the range of applicable film formation condition, it is appropriate that the ratio of $H_2$ gas to $SiH_4$ gas is selected within the range of 0% to 95%, the pressure is 5 to 266 Pa, the RF power density is 5 to 80 mW/cm$^2$, and the substrate temperature is 80 to 350° C. It is preferable that the deposition film thickness is within the range of 100 to 2000 nm, and in this embodiment, the thickness was made 700 nm.

Instead of the substantially intrinsic amorphous silicon film, it is also possible to form an amorphous silicon carbide film, an amorphous silicon germanium film, or an amorphous silicon tin film by introducing a gas of hydride, fluoride, or chloride of carbon (C), germanium (Ge), or tin (Sn) in addition to the $SiH_4$ gas at the film formation.

Next, a step of introducing a p-type conductivity determining impurity element into the second microcrystalline silicon film 105a to form a p-type microcrystalline silicon film 105b was carried out by an ion doping method.

In an ion doping apparatus of this embodiment, a roll-to-roll system apparatus corresponding to the elongate substrate is used. Like the foregoing film formation step, the elongate substrate 101 was continuously wound out of a feeding bobbin, was made to pass through a doping chamber, and was rewound on a rewinding bobbin. A linear ion source provided in the doping chamber was used, and its linear ion beam was applied to cross at right angles with the transfer direction of the elongate substrate 101 to implant ions, so that a continuous process was carried out while the elongate substrate 101 was transferred.

As the p-type conductivity determining impurity element to the microcrystalline silicon film, it is appropriate that one kind of or plural kinds of elements in group 111b of the periodic table, such as boron (B), aluminum (Al), gallium (Ga), and indium (In) are added. The ion doping method is such a method that a gas of hydride, chloride, fluoride or the like of the foregoing impurity elements is made plasma, ions of the impurity elements are produced, and an electric field is applied in a direction where the ions are accelerated toward a substrate, so that the ions are implanted in the substrate. In this embodiment, a $B_2H_6$ gas was used. It is appropriate that a dosage is within the range of $2.0 \times 10^{13}$ to $5.0 \times 10^{15}$/cm$^2$, and here, the dosage was made $1.0 \times 10^{14}$/cm$^2$ (FIG. 1C).

In the ion doping method, implanted elements have a concentration distribution in the depth direction by an acceleration voltage, and it becomes necessary to suitably adjust this value. In the case of a solar battery, although the optimum condition is different by the thickness of the p-type layer, the acceleration voltage is set within the range of 5 to 25 keV. In this embodiment, the acceleration voltage was made 15 keV. When B was implanted under the condition that the dosage was $1.0\times10^{14}/cm^2$ and the acceleration voltage was 10 keV, and the concentration of B implanted in the film was investigated by a secondary ion mass spectroscopy, it was found that the concentration at the peak position was about $9\times10^{19}$ to $1\times10^{20}/cm^3$.

The foregoing p-type impurity element may be implanted into an interfacial region (P/I interface) between the second microcrystalline silicon film 105*a* and the substantially intrinsic amorphous silicon film 104 being in contact with the second microcrystalline silicon film 105*a*. In the technical field of a solar battery, a method of improving the junction characteristics of an interface by continuously changing the p-type impurity concentration at the P/I interface is a conventionally known technique. In the prior art, in a film formation step, although it is necessary to precisely control the flow of gas including a very small amount of p-type impurity element by using a computer or the like, according to the present invention, in a step of the ion doping method, it is satisfactory if only an acceleration voltage is controlled, so that it has become possible to more precisely control the impurity concentration in the thickness direction at the interface.

An integrating and processing step was carried out so that each of the photoelectric conversion layer and the electrode was divided in the same substrate surface, and divided ones were connected in series. The integrating and processing step is carried out by a well-known technique, and includes a step of forming an opening in the photoelectric conversion layer and the electrode by a laser scribing method and a step of forming an insulating region by a screen printing method. In any steps, a roll-to-roll system apparatus was used. Particulars with respect to the design of the integrating and processing step are in accordance with well-known examples, and they will not be described here in detail.

First openings 107*a* and 107*b* are openings for insulation and separation, which are formed in the photoelectric conversion layer and the first electrode, and these openings 107*a* and 107*b* are used for the purpose of forming a plurality of unit cells on the same substrate surface. Second openings 108*a* and 108*b* are provided adjacently to the first openings 107*a* and 107*b*, respectively, and each is an opening to connect the first electrode 102 and an adjacent second electrode 106 formed later. The formation of the openings was made by a laser scribing method (FIG. 1D).

After the first openings 107*a* and 107*b* and the second openings 108*a* and 108*b* were formed, insulating resins were printed by a screen printing method. With respect to the insulating resins, first insulating resin regions 109*a* and 109*b* and second insulating resin regions 111*a* and 111*b* were formed. The first insulating resin regions 109*a* and 109*b* are formed on the first openings 107*a* and 107*b* and are filled in the openings, and the second insulating resin regions 111*a* and 111*b* are provided adjacently to the second openings 108*a* and 108*b*. Although a commercially available product may be used for the insulating resin, it is desirable that the resin is an acryl-based or urethane-based resin and can be fired at about 200° C. Although the thickness of the insulating resin is not particularly limited within a range, the thickness here was made 20 μm (FIG. 1E).

The second electrode 106 was formed so as to cover the second microcrystalline silicon film 105*b*, the first insulating resin regions 109*a* and 109*b*, and the second insulating resin regions 111*a* and 111*b*. The second electrode 106 was a transparent electrode, and was formed by a roll-to-roll system sputtering apparatus. Specifically, it is satisfactory if a film of $SnO_2$, ZnO, ITO or the like is formed, and here, an ITO film with a thickness of 70 nm was formed by the sputtering method (FIG. 1F).

Third openings 112*a* and 112*b* for dividing the second electrode 106 into respective unit cells were formed adjacently to the second openings and on the second insulating resin regions 111*a* and 111*b* by the laser scribing method (FIG. 1G).

Since the second electrode 106 has relatively high resistivity, if an auxiliary electrode 113 is formed, a further desirable structure is obtained. Auxiliary electrodes 113*a* and 113*b* are provided to be in close contact with the second electrode 106, and are formed so as to cover the second openings 108*a* and 108*b*. Each of the auxiliary electrodes is made of a metal material having high conductivity, and here, it was formed of silver (Ag) in a comb shape by the screen printing method (FIG. 1G).

Since the B element implanted in the second microcrystalline silicon film 105*a* do not directly function as a p-type impurity element, a step of activation by a heat treatment becomes necessary. It is appropriate that the step of the heat treatment is carried out in an air atmosphere, nitrogen atmosphere, or hydrogen atmosphere, and the step can be carried out in the temperature range of 150 to 450° C., preferably in the range of 200 to 400° C. Here, a solar battery with a predetermined size was cut out from the elongate substrate, it was made sheet-shaped, and a clean oven was used to carry out a heat treatment in the air atmosphere at 200° C. for 2 hours so that activation was made (FIG. 1H).

The change of conductivity of a microcrystalline silicon film by a heat treatment was ascertained by an experiment in advance. The conductivity of the microcrystalline silicon film formed from a $SiH_4$ gas and an $H_2$ gas without adding p-type and n-type conductivity determining impurity elements is about $5\times10^{-4}$ S/cm as an initial value. According to experimental results obtained by the present inventors, when a p-type impurity was implanted and a heat treatment was carried out, the conductivity of $5\times10^{-3}$ S/cm or more was able to be obtained, and it was possible to raise the conductivity up to a maximum of $5\times10^1$ S/cm.

Figure 5:
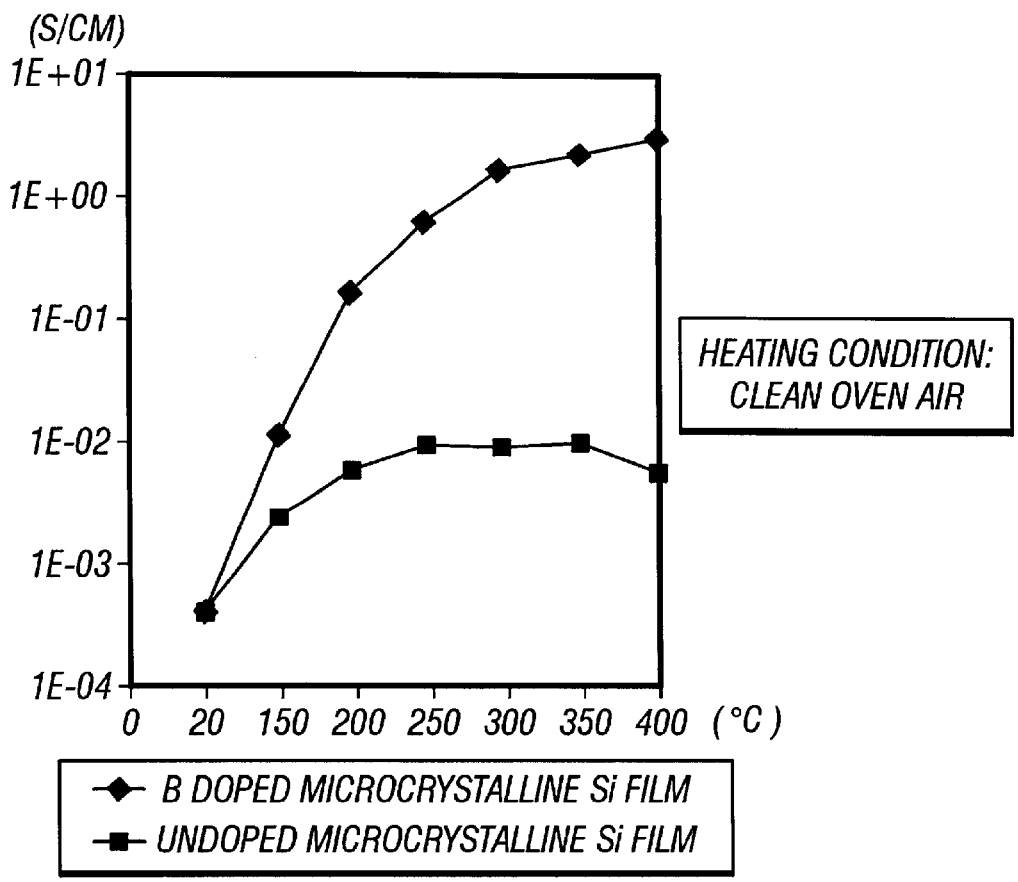
FIG. 5 is a graph showing variation of conductivity of microcrystalline silicon films which show p-type and n-type conductivities and are obtained by the present invention, with respect to temperatures of heat treatment.

Moreover, it was found that when a similar heat treatment was applied without implanting a p-type impurity, the conductivity was raised from about $5\times10^{-4}$ S/cm of the initial value to $5\times10^{-2}$ S/cm. The data of FIG. 5 show the results when the dosage of B (boron) is $1\times10^{14}/cm^2$. The conductivity was increased up to $1.2\times10^{-2}$ S/cm by a heat treatment of 150° C., and it was possible to increase the conductivity up to $1.5\times10^{-1}$ S/cm by a heat treatment of 200° C. Thus, this microcrystalline silicon film added with B (boron) can be used as a p-type microcrystalline silicon film.

Moreover, when a similar heat treatment was applied to a microcrystalline silicon film in which p-type and n-type conductivity determining impurity elements were not implanted, the conductivity was increased from $5\times10^{-3}$ S/cm to $1\times10^{-2}$ S/cm. Since the microcrystalline silicon film in which an impurity element is not implanted has n-type conductivity, this film can be used as an n-type microcrystalline silicon film.

By applying a step of heat treatment, it was possible to obtain the photoelectric conversion layer composed of the first n-type microcrystalline silicon film 103, the substantially intrinsic amorphous silicon film 104, and the second p-type microcrystalline silicon film 105*b*.

Through the above steps, it was possible to manufacture a solar battery in which a plurality of unit cells 110*a*, 110*b*, and 110*c* are connected to each other in series. The method of manufacturing a solar battery described in this embodiment includes a step of forming a first electrode, a step of forming a first microcrystalline silicon film, a step of forming a substantially intrinsic amorphous silicon film, a step of forming a second microcrystalline silicon film, a step of implanting a p-type conductivity determining impurity element into the second microcrystalline silicon film, a step of applying a heat treatment to the first and second microcrystalline silicon films and the substantially intrinsic amorphous silicon film, and a step of forming a second electrode. If the first or second electrode is patterned by a well-known method, and a step of arrangement into a predetermined position on the surface of the substrate is added, the method can be applied to the manufacture of a series connection structure of solar batteries, an image sensor, or a photosensor.

[Embodiment 2]

Another embodiment of the present invention will be described in accordance with manufacturing steps of a solar battery shown in FIGS. 4A to 4H. In this embodiment, an organic resin film elongate substrate 401 wound on a bobbin into a roll shape was used. Organic resin film materials desirable for the manufacture of a solar battery of this embodiment include polyethylene terephthalate, polyethylene naphthalate, polyether sulfone, polyimide, and aramid. Here, the elongate substrate 401 having a thickness of 100 $\mu$m and made of polyethylene naphthalate (PEN) was used.

Figure 4A:
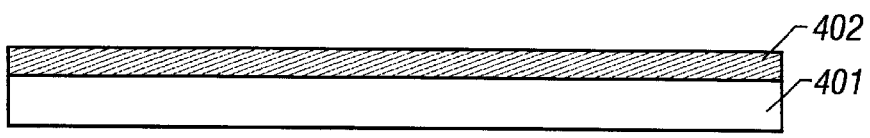
FIGS. 4A to 4H are schematic views showing an example of a method for manufacturing a photoelectric conversion device according to the present invention.

First, a first electrode 402 was formed on the surface of the elongate substrate 401. The first electrode 402 was formed by a roll-to-roll system sputtering apparatus. A film forming method is not particularly limited, and a well-known method such as a vacuum evaporation method can also be used. It is appropriate that the first electrode 402 is formed of a light reflective metallic electrode of a material selected from Al, Ag, Ti, Cr, Ni, and Pt. As a required film thickness, although it is sufficient if the electrode has a thickness of about 100 to 300 nm, even if the thickness is not within this range, it does not relate to the structure of the present invention. Here, the first electrode was formed in such a manner that an Al film with a thickness of 150 nm was formed by a sputtering method and further, a Ti film with a thickness of 20 nm was formed by the sputtering method on the surface of the Al film (FIG. 4A).

Figure 4B:
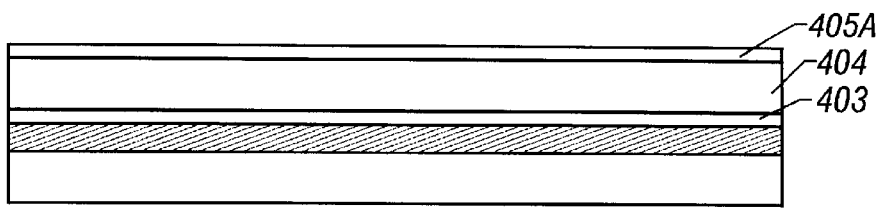

Next, by using the roll-to-roll system plasma CVD apparatus shown in FIG. 3, a photoelectric conversion layer to be in close contact with the first electrode 402 was formed. In the photoelectric conversion layer, a first microcrystalline silicon film 403, a substantially intrinsic amorphous silicon film 404, and a second microcrystalline silicon film 405a were formed in this order from the side of the first electrode 402. The first microcrystalline silicon film 403 and the second microcrystalline silicon film 405a formed without adding p-type and n-type conductivity determining impurity elements, and the substantially intrinsic amorphous silicon film 404 were formed in the same manner as the embodiment 1 (FIG. 4B).

After the first and second microcrystalline silicon films 403 and 405a which will become photoelectric conversion layer, and the substantially intrinsic amorphous silicon film 404 were formed, an integrating and processing step was carried out in which each of the photoelectric conversion layer and the electrode was divided in the same substrate surface to form unit cells, which were connected in series. The integrating and processing step is carried out by a well-known technique, and includes a step of forming openings in the photoelectric conversion layer and the electrode by a laser scribing method, and a step of forming insulating resins by a screen printing method. In any steps, a roll-to-roll system apparatus was used. The particulars with respect to the design of the integrating and processing step are in accordance with conventional examples, so that their details will not be described here.

Figure 4C:
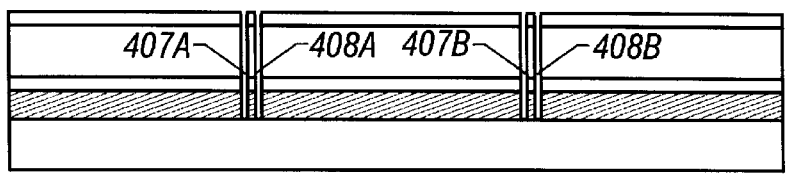

First openings 407a and 407b are openings for insulation and separation, which are formed in the photoelectric conversion layer and the first electrode 402, and these openings 407a and 407b are used for the purpose of forming a plurality of unit cells on the same substrate surface. Second openings 408a and 408b are respectively provided adjacently to the first openings 407a and 407b, and each is an opening for connecting the first electrode 402 and an adjacent second electrode 406 formed later. The formation of the openings was carried out by a laser scribing method (FIG. 4C).

Figure 4D:
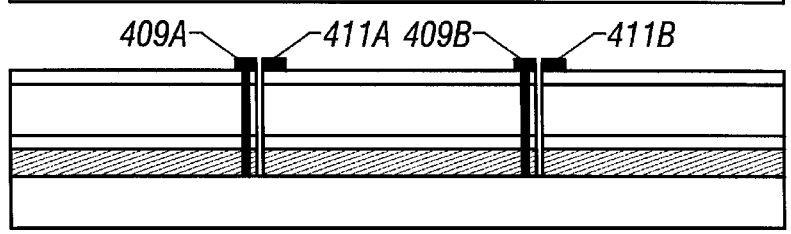

After the first openings 407a and 407b and the second openings 408a and 408b were formed, insulating resins were printed by a screen printing method, so that first insulating resin regions 409a and 409b and second insulating resin regions 411a and 411b were formed. The first insulating resin regions 409a and 409b are formed on the first openings 407a and 407b and are filled in the openings, and the second insulating resin regions 411a and 411b are provided adjacently to the second openings 408a and 408b. Although a commercially available product may be used for the insulating resin, it is desirable that the resin is an acryl-based or urethane-based resin and can be fired at about 200° C. Although the thickness of the insulating resin is not particularly limited within a range, the thickness here was made 20 $\mu$m (FIG. 4D).

Figure 4E:
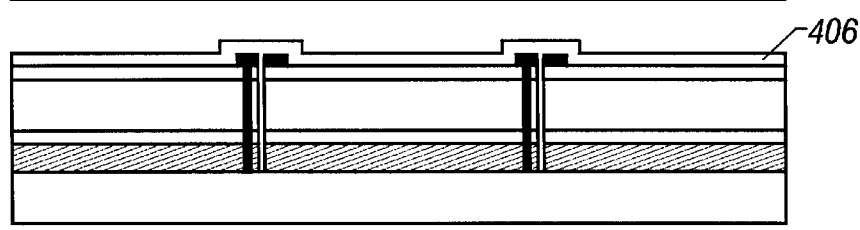

The second electrode 406 was formed so as to cover the second microcrystalline silicon film 405b, the first insulating resin regions 409a and 409b, and the second insulating resin regions 411a and 411b. The second electrode 406 is a transparent electrode, and was formed by a roll-to-roll system sputtering apparatus. Specifically, it is As satisfactory if a film of $SnO_2$, ZnO, ITO or the like is used, and here, an ZnO film with a thickness of 70 nm was formed (FIG. 4E).

Figure 4F:
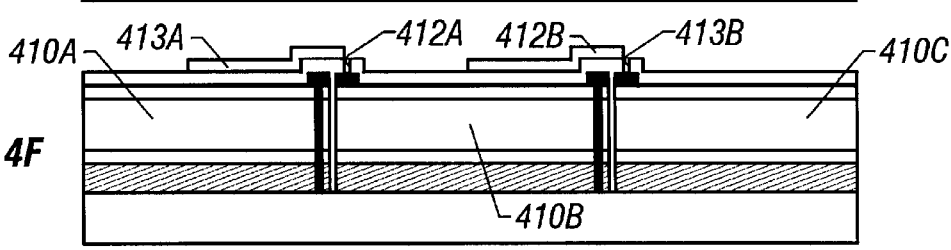

Third openings 412a and 412b for dividing the second electrode 406 into respective unit cells were formed adjacently to the second openings and on the second insulating resin regions 411a and 411b by a laser scribing method (FIG. 4F).

Since the second electrode 406 has relatively high resistivity, if an auxiliary electrode 413 is formed, a further desirable structure is obtained. Auxiliary electrodes 413a and 413b are provided to be in close contact with the second electrode 406, and are formed so as to cover the second openings 408a and 408b. Each of the auxiliary electrodes is made of a metal material with high conductivity, and here, it was formed of silver (Ag) in a comb shape by a screen printing method (FIG. 4F).

After the above steps, a step of introducing a p-type conductivity determining impurity element into the second microcrystalline silicon film 405a from the surface of the second electrode 406 was carried out by using an ion doping method.

An ion doping apparatus of this embodiment was a roll-to-roll system apparatus corresponding to the elongate substrate 401. Like the foregoing film forming steps, the elongate substrate 401 was continuously wound out of a feeding bobbin, was made to pass through a doping chamber, and was rewound on a rewinding bobbin. An ion source provided in the doping chamber was able to make linear irradiation, and the linear irradiation was made so as to cross at right angles with the transfer direction of the elongate substrate 401 so that a continuous process was carried out while the elongate substrate 401 was transferred.

Figure 4G:
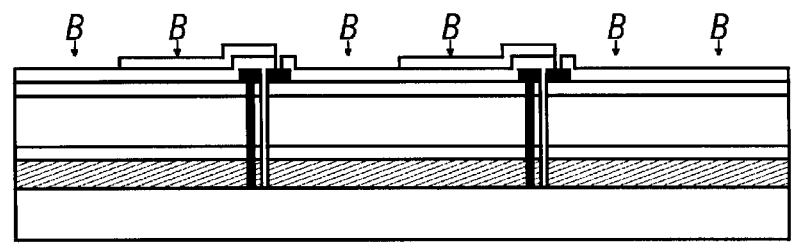

As the p-type conductivity determining impurity element for the microcrystalline silicon film, it is appropriate that a kind of or plural kinds of elements in group 111b of the periodic table, such as boron (B), aluminum (Al), gallium (Ga), and indium (In), are added. The ion doping method is such a method that a gas of hydride, chloride, fluoride or the like of the foregoing impurity elements is made plasma, ions of the impurity elements are produced, and an electric field is applied in a direction where the ions are accelerated toward a substrate, so that the ions are implanted into the substrate. In this embodiment, a $B_2H_6$ gas was used. It is appropriate that the dosage is within the range of $2.0 \times 10^{13}$ to $5.0 \times 10^{15}/cm^2$, and here, the dosage was made $1.0 \times 10^{14}/cm^2$ (FIG. 4G).

In the ion doping method, implanted elements have a concentration distribution in a depth direction by an acceleration voltage, and it becomes necessary to suitably adjust this value. In the case of a solar battery, although the optimum condition is different by the thickness of the p-type layer, the acceleration voltage is set within the range of 5 to 25 keV. In this embodiment, it was made 15 keV. When B was implanted under the condition that the dosage was $1.0 \times 10^{14}/cm^2$ and the acceleration voltage was 10 keV, and the concentration of B implanted in the film was investigated by a secondary ion mass spectroscopy, it was found that the concentration at the peak position was about $9 \times 10^{19}$ to $1 \times 10^{20}/cm^3$.

The foregoing p-type impurity element may be implanted into an interfacial region (P/I interface) between the second microcrystalline silicon film 405a and the substantially intrinsic amorphous silicon film 404 being in contact with the second microcrystalline silicon film 405a by increasing the acceleration voltage. In the technical field of a solar battery, a method of improving the junction characteristics of an interface by continuously changing a p-type impurity concentration at the P/I interface is a conventionally known technique. In the prior art, in a film forming step, although it is necessary to precisely control the flow of gas including a very small amount of p-type impurity element by using a computer or the like, according to the present invention, in the step of the ion doping method, it is satisfactory if only the acceleration voltage is controlled, so that it has become possible to make the control of the impurity concentration at the P/I interface in the thickness direction more precisely.

Since the implanted B element does not directly function as a p-type impurity element, a step of activation by a heat treatment becomes necessary. It is appropriate that the step of the heat treatment is carried out in an air atmosphere, nitrogen atmosphere, or hydrogen atmosphere, and the step can be carried out in the temperature range of 150 to 450° C., and is preferably carried out in the range of 200 to 400° C. Here, a solar battery with a predetermined size was cut out from the elongate substrate, was made sheet-shaped, and a clean oven was used so that a heat treatment was carried out in the air atmosphere at 200° C. for 2 hours.

The change of conductivity of a microcrystalline silicon film by a heat treatment was ascertained by an experiment in advance. The conductivity of a microcrystalline silicon film formed from a $SiH_4$ gas and an $H_2$ gas without adding p-type and n-type conductivity determining impurity elements is about $5 \times 10^{-4}$ S/cm as an initial value. According to experimental results obtained by the present inventors, when a p-type impurity was implanted in the microcrystalline silicon film and a heat treatment was carried out, the conductivity of $5 \times 10^{-3}$ S/cm or more was obtained, and the conductivity was able to be increased up to a maximum of $5 \times 10^1$ S/cm. Even if a similar heat treatment was carried out without implanting the p-type impurity, the conductivity was able to be increased up to $5 \times 10^{-2}$ S/cm.

The data of FIG. 5 show results when the dosage of B (boron) is $1 \times 10^{14}/cm^2$. The conductivity was able to be increased up to $1.2 \times 10^{-2}$ S/cm by a heat treatment of 150° C. and up to $1.5 \times 10^{-1}$ S/cm by a heat treatment of 200° C. Thus, the microcrystalline silicon film added with B (boron) can be used as a p-type silicon film.

Moreover, when a similar heat treatment was applied to a microcrystalline silicon film in which an impurity element was not implanted, the conductivity was increased from $5 \times 10^{-3}$ S/cm to $1 \times 10^{-2}$ S/cm. Since a microcrystalline silicon film in which an impurity element is not implanted had n-type conductivity, this film was able to be used as an n-type microcrystalline silicon film.

Figure 4H:
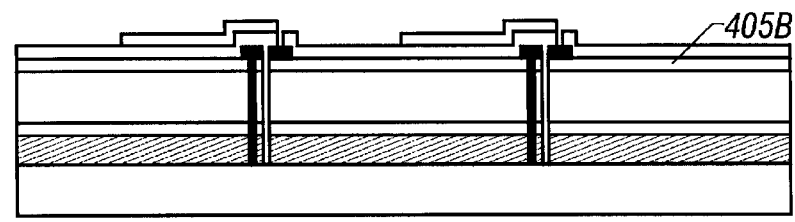

Since the microcrystalline silicon film formed without adding the p-type and n-type conductivity determining impurity elements shows the n-type conductivity, by adding a step of heat treatment, the photoelectric conversion layer composed of the first n-type microcrystalline silicon film 403, the substantially intrinsic amorphous silicon film 404, and the second p-type microcrystalline silicon film 405b was formed so that the solar battery was able to be manufactured (FIG. 4H).

Through the above steps, it was able to manufacture the solar battery in which a plurality of unit cells 410a, 410b, and 410c are connected in series to each other. The method of manufacturing the solar battery described in this embodiment includes a step of forming a first electrode, a step of forming a first microcrystalline silicon film, a step of forming a substantially intrinsic amorphous silicon film, a step of forming a second microcrystalline silicon film, a step of implanting a p-type conductivity determining impurity element into the second microcrystalline silicon film, a step of applying a heat treatment to the first and second microcrystalline silicon films and the substantially intrinsic amorphous silicon film, and a step of forming a second electrode. If the first or second electrode is patterned by a well-known method, and a step of arrangement into a predetermined position on the surface of the substrate is added, the method can be applied to the manufacture of a series connection structure of a solar battery, an image sensor, or a photosensor.

[Embodiment 3]

Still another embodiment of the present invention will be described in accordance with the manufacturing steps shown in FIGS. 4A to 4H. In this embodiment, a polyethylene naphthalate (PEN) layer with a thickness of 80 $\mu m$ was used as a substrate 401. The substrate 401 was an elongate substrate wound on a bobbin and supplied, and was suitable for the manufacture of a solar battery by using a roll-to-roll system apparatus. Other than the PEN, a material such as polyethylene terephthalate, polyether sulfone, polyimide, or aramid, was able to be applied.

A first electrode 402 was formed on one side surface of the elongate substrate 401. The first electrode 402 was formed by a roll-to-roll system sputtering apparatus. It is appropriate that the first electrode 402 is formed of a light reflective metallic electrode of a material selected from Al, Ag, Ti, Cr, Ni, and Pt. As a required film thickness, although it is sufficient if the electrode has a thickness of about 100 to 300 nm, even if the thickness is not within this range, it does not relate to the structure of the present invention. Here, a Ti film with a thickness of 200 nm was formed (FIG. 4A).

Figure 6:
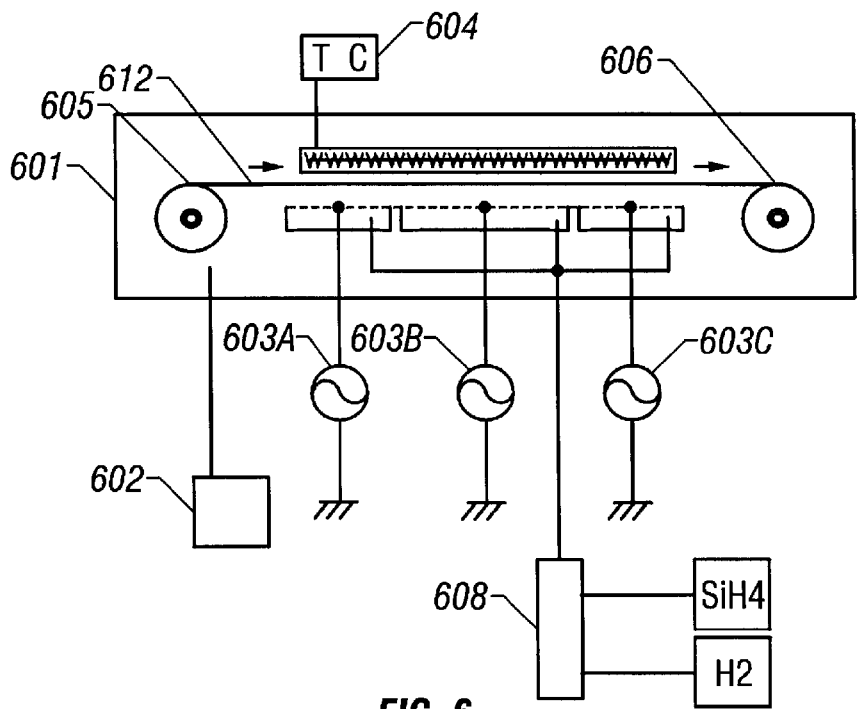
FIG. 6 is a schematic view showing a roll-to-roll system plasma CVD apparatus of Embodiment 3.

Next, by using a roll-to-roll system plasma CVD apparatus shown in FIG. 6, a step of forming a photoelectric conversion layer on the surface of the first electrode 402 was carried out. In the photoelectric conversion layer, a first microcrystalline silicon film 403 not added with p-type and n-type conductivity determining impurity elements, a substantially intrinsic amorphous silicon film 404, and a second microcrystalline silicon film 405a not added with p-type and n-type conductivity determining impurity elements were formed in this order from the side of the first electrode 402 (FIG. 4B).

In the roll-to-roll system plasma CVD apparatus of FIG. 6, exhaust means 602, a plurality of glow discharge plasma generating means 603a, 603b, and 603c, substrate heating means 604, and reaction gas supply means 608 are provided in a reaction chamber 601. An elongate substrate 612 is fed from a feeding bobbin 605, and is rewound on a rewinding bobbin 606. The plurality of glow discharge plasma generating means 603a, 603b, and 603c are sequentially arranged in the transfer direction of the elongate substrate 612, and the conditions of glow discharge can be individually controlled.

In this embodiment, the first microcrystalline silicon film 403 is formed by the glow discharge plasma generating means 603a, the substantially intrinsic amorphous silicon film 404 is formed by the glow discharge plasma generating means 603b, and the second microcrystalline silicon film 405a is formed by the glow discharge plasma generating means 603c, so that the step of forming the films is completed by one transfer of the substrate. Any of the first and second microcrystalline silicon films 403 and 405a, and the substantially intrinsic amorphous silicon film 404 are made from a reaction gas obtained by mixing a $SiH_4$ gas and an $H_2$ gas, and the reaction gas is not necessarily required to be separated for each plasma generating means. Thus, it is not necessary to provide a coupling slit for isolating a reaction gas in one reaction chamber from that in the other reaction chamber, which is required in the conventional roll-to-roll system plasma CVD apparatus.

The film forming steps of this embodiment will be described with reference to FIGS. 4A to 4H and FIG. 6. While the elongate substrate 612 was wound out of the feeding bobbin 605, the $SiH_4$ gas and the $H_2$ gas were supplied from the reaction gas supply means 608 and only the power of glow discharge was adjusted as described later, so that the first microcrystalline silicon film 403 was formed by the glow discharge plasma generating means 603a, the substantially intrinsic amorphous silicon film 404 was formed by the glow discharge plasma generating means 603b, and the second microcrystalline silicon film 405a was formed by the glow discharge plasma generating means 603c.

The first microcrystalline silicon film 403 and the second microcrystalline silicon film 405a which were formed without adding p-type and n-type conductivity determining impurity elements were formed under the same condition. Specifically, the film formation was carried out under the condition that the flow of $SiH_4$ was 40 sccm, the flow of $H_2$ was 400 sccm, the pressure was kept at 133 Pa, and an RF (13.56 MHZ) power of 160 mW/cm² was applied by the glow discharge plasma generating means 603a and 603c. At this time, the temperature of the substrate was kept at 160° C. With respect to a film formation condition of the microcrystalline silicon film, a basically well-known technique is used, and the condition is not limited to the above-mentioned film formation condition. When the flow of $SiH_4$ was 40 sccm and the flow of $H_2$ was 400 sccm, an applicable RF power density was 60 to 250 mW/cm².

The substantially intrinsic amorphous silicon film 404 was formed under the condition that the flow of $SiH_4$ was 40 sccm, the flow of $H_2$ was 400 sccm, the pressure was kept at 133 Pa, the temperature of the substrate was kept at 160° C., and an RF (13.56 MHZ) power of 40 mW/cm² was applied by the glow discharge plasma generating means 603b. Although the condition for the formation of the amorphous silicon film is not limited, when the flow of $SiH_4$ was 40 sccm and the flow of $H_2$ was 400 sccm, a suitable RF power density was 5 to 50 mW/cm².

The thicknesses of the first microcrystalline silicon film 403, the substantially intrinsic amorphous silicon film 404, and the second microcrystalline silicon film 405a were adjusted by the transfer speed of the elongate substrate 412. At this time, the length, in the substrate transfer direction, of a discharge electrode as a structural element of the glow discharge plasma generating means is also required to be set to a suitable length, which was a problem in design. Here, the film formation was carried out such that the thickness of the first microcrystalline silicon film 403 was 25 nm, the thickness of the substantially intrinsic amorphous silicon film 404 was 700 nm, and the thickness of the second microcrystalline silicon film 405a was 15 nm.

After the above steps, an integrating and processing step was carried out in which each of the photoelectric conversion layer and the electrode was divided in the same substrate surface to form unit cells, which were connected in series to each other. The integrating and processing step is carried out by a well-known technique, and includes a step of forming openings in the photoelectric conversion layer and the electrode by a laser scribing method, and a step of forming insulating resins by a screen printing method. The particulars of the design of the integrating and processing step are in accordance with conventional examples, so that their details will not be described here.

First openings 407a and 407b are openings for insulation and separation formed in the photoelectric conversion layer and the first electrode 402, and a plurality of unit cells are formed on the same substrate by these openings. Second openings 408a and 408b are respectively provided adjacently to the first openings 407a and 407b, and each is an opening for connecting the first electrode 402 and an adjacent second electrode 406. The formation of the openings was carried out by a laser scribing method (FIG. 4C).

After the first openings and the second openings were formed, insulating resins was printed by a screen printing method so that first insulating resin regions 409a and 409b and the second insulating resin regions 411a and 411b were formed. The first insulating resin regions 409a and 409b are formed on the first openings 407a and 407b and are filled in the openings, and the second insulating resin regions 411a and 411b are respectively provided adjacently to the second openings 408a and 408b. Although a commercially available product may be used for the insulating resin, it is desirable that the resin is an acryl-based or urethane-based resin and can be fired at about 200° C. Although the thickness of the insulating resin was not particularly limited within a range, the thickness here was made 20 $\mu$m (FIG. 4D).

Second electrode 406 was formed so as to cover the second microcrystalline silicon film 405b, the first insulating resin regions 409a and 409b, and the second insulating resin regions 411a and 411b. The second electrode 406 is a transparent electrode, and was formed by a roll-to-roll system sputtering apparatus. Specifically, it is satisfactory if a film of $SnO_2$, ZnO, ITO or the like is formed, and here, an ZnO film with a thickness of 70 nm was formed by a sputtering method (FIG. 4E).

Third openings 411a and 411b for dividing the second electrode 406 into respective unit cells were formed adjacently to the second openings and on the second insulating resin regions by a laser scribing method (FIG. 4F).

Since the second electrode 406 has relatively high resistance, if auxiliary electrodes 413a and 413b are formed, a more desirable structure can be obtained. The auxiliary electrodes are provided to be in close contact with the second electrode 406, and are formed so as to cover the second openings 408a and 408b. It is desirable that the auxiliary electrodes are made of a metal material having high conductivity, and here, they were formed of silver (Ag) in a comb shape by a screen printing method (FIG. 4F).

After the above steps, a step of forming a p-type microcrystalline silicon film 405b was carried out in which a p-type conductivity determining impurity element was introduced into the second microcrystalline silicon film 405a from the surface of the second electrode 406 by an ion doping method, and a heat treatment was applied. It is appropriate that as impurities enabling valence electron control to p-type, a kind of or plural kinds of elements in group 111b of the periodic table, such as boron (B), aluminum (Al), gallium (Ga), and indium (In), are added to the microcrystalline silicon film. The ion doping method is such a method that a gas of hydride, chloride, fluoride or the like of the foregoing impurity elements is made plasma, and an electric field is applied in a direction in which produced ions of the impurity elements are accelerated toward a substrate, so that the ions are implanted into the substrate. In this embodiment, a $B_2H_6$ gas as a typical p-type impurity gas was used. It is appropriate that the dosage is within the range of $2.0 \times 10^{13}$ to $5.0 \times 10^{15}/cm^2$, and here, the dosage was made $1.0 \times 10^{14}/cm^2$ in this embodiment (FIG. 4G).

An ion doping apparatus used here was a roll-to-roll system apparatus corresponding to the elongate substrate of this embodiment. Like the foregoing film forming steps, the elongate substrate 401 was continuously wound out of a feeding bobbin, was made to pass through a doping chamber, and was rewound on a rewinding bobbin. An ion source provided in the doping chamber was a linear one, and irradiation was made so that a linear ion beam crossed at right angles with the transfer direction of the elongate substrate 401, and ions were implanted.

In the ion doping method, implanted elements have a concentration distribution in a depth direction by an acceleration voltage, and it becomes necessary to suitably adjust this value. In the case of a solar battery, although the optimum condition is different by the thickness of a p-type layer, the acceleration voltage is set within the range of 5 to 25 keV. In this embodiment, it was made 10 keV. When B was implanted under the condition that the dosage was $1.0 \times 10^{14}/cm^2$ and the acceleration voltage was 10 keV, and the concentration of B implanted in the film was investigated by a secondary ion mass spectroscopy, it was found that the concentration at the peak position was about $9 \times 10^{19}$ to $1 \times 10^{20}/cm^3$.

The foregoing p-type impurity element may be implanted into an interfacial region (P/I interface) between the second microcrystalline silicon film 405a and the substantially intrinsic amorphous silicon film 404 being in contact with the second microcrystalline silicon film 405a by increasing an acceleration voltage. In the technical field of a solar battery, a method of improving the junction characteristics of an interface by continuously changing a p-type impurity concentration at the P/I interface is a conventionally known technique. In the prior art, although it is necessary in a film forming step to precisely control the flow of gas including a very small amount of p-type impurity element by using a computer or the like, according to the present invention, it is satisfactory if only an acceleration voltage is controlled in a step of an ion doping method, so that it has become easy to make the control of the impurity concentration at the interface in the film thickness direction.

Since the implanted B element does not directly function as a p-type impurity element, a step of activation by a heat treatment becomes necessary. It is appropriate that the step of the heat treatment is carried out in an air atmosphere, nitrogen atmosphere, or hydrogen atmosphere, and the step can be carried out in the temperature range of 150 to 450° C., and is preferably carried out in the range of 200 to 400° C. Here, a solar battery with a predetermined size was cut out from the elongate substrate, was made sheet-shaped, and a heat treatment was carried out in the air atmosphere at 200° C. for 2 hours by using a clean oven.

By this heat treatment, the added p-type impurity element was activated, so that the conductivity of the microcrystalline silicon film 405a was increased up to $1.5 \times 10^{-1}$ S/cm, and an activated p-type microcrystalline silicon film 405b was able to be obtained. A heat treatment was also applied to the microcrystalline silicon film 403 in which a p-type impurity element was not implanted, so that the conductivity thereof was increased from $5 \times 10^{-3}$ S/cm to $1 \times 10^{-2}$ S/cm. Thus, this film 403 can be used as an n-type microcrystalline silicon film.

Since a microcrystalline silicon film formed without adding p-type and n-type conductivity determining impurity elements shows n-type conductivity, the photoelectric conversion layer composed of the first n-type microcrystalline silicon film, the substantially intrinsic amorphous silicon film, and the second p-type microcrystalline silicon film was formed by carrying out a step of heat treatment, and the solar battery was able to be manufactured (FIG. 4H).

Through the above steps, it was able to manufacture the solar battery in which a plurality of unit cells 410a, 410b, and 410c were connected in series to each other. The manufacturing method of the solar battery described in this embodiment includes a step of forming a first electrode, a step of forming a first microcrystalline silicon film, a step of forming a substantially intrinsic amorphous silicon film, a step of forming a second microcrystalline silicon film, a step of implanting a p-type conductivity determining impurity element into the second microcrystalline silicon film, a step of applying a heat treatment to the first and second microcrystalline silicon films and the substantially intrinsic amorphous silicon film, and a step of forming a second electrode. If the first or second electrode is patterned by a well-known method, and a step of arrangement into a predetermined position on the surface of the substrate is added, the method can be applied to the manufacture of a series connection structure of a solar battery, an image sensor, or a photosensor.

According to the present invention, in the step of forming p-type and n-type microcrystalline silicon films and a substantially intrinsic i-type amorphous silicon film, it is not necessary to take degradation due to p-type and n-type impurities into consideration, and the p-type and n-type microcrystalline silicon films and the substantially intrinsic amorphous silicon film can be formed of only a reactive gas obtained by mixing a $SiH_4$ gas or a $Si_2H_6$ gas with an $H_2$ gas.

Thus, in a roll-to-roll system CVD apparatus, it is not necessary to provide a continuous slit which is a problem in the prior art, and semiconductor films constituting a photoelectric conversion layer can be formed in the same reaction chamber. Even in the case where a roll-to-roll system plasma CVD apparatus provided with a plurality of glow discharge plasma generating means is used, it is not necessary to provide a plurality of reaction chambers for the plurality of plasma generating means as in the prior art, but the plurality of plasma generating mean can be provided in one reaction chamber. This enables the structure of the roll-to-roll system plasma CVD apparatus to be simplified.

Thus, according to the present invention, by a step of forming a first electrode, a step of forming a first microcrystalline silicon film, a step of forming a substantially intrinsic amorphous silicon film, a step of forming a second microcrystalline silicon film, a step of implanting a p-type conductivity determining impurity element into the second microcrystalline silicon film, and a step of applying a heat treatment to the first and second microcrystalline silicon films and the substantially intrinsic amorphous silicon film, it is possible to obtain the microcrystalline silicon films showing p-type and n-type conductivities and the substantially intrinsic amorphous silicon film, and the PIN junction can be formed. Thus, it is not necessary to use an n-type impurity element which is conventionally required.

Moreover, when the p-type conductivity determining impurity element is implanted from the surface of the second microcrystalline silicon film by using an ion doping method, it is possible to easily control the concentration distribution of the p-type impurity in the film thickness direction by the control of an acceleration voltage at the time of the implantation.

When the p-type impurity is implanted by the ion doping method into the microcrystalline silicon film which has not been added with p-type and n-type conductivity determining impurity elements and a heat treatment is applied to the film, a p-type microcrystalline silicon film can be obtained. Moreover, when a heat treatment is applied to the microcrystalline silicon film which has not been added with p-type and n-type conductivity determining impurity elements to raise the conductivity of the microcrystalline silicon film, the film can be used as an n-type microcrystalline silicon film.

What is claimed is:

1. A method for manufacturing a photoelectric conversion device by a roll-to-roll system production means, said photoelectric conversion device including a unit cell or a plurality of unit cells connected to each other, said unit cell including a laminate over an organic resin substrate comprising:
a first electrode,
a photoelectric conversion layer, and
a second electrode,
said method comprising the steps of:
forming the first electrode over the organic resin substrate;
forming a first microcrystalline semiconductor film adjacent to the first electrode without adding n-type and p-type impurities;
forming a substantially intrinsic amorphous semiconductor film adjacent to the first microcrystalline semiconductor film;
forming a second microcrystalline semiconductor film adjacent to the substantially intrinsic amorphous semiconductor film without adding n-type and p-type impurities;
introducing a p-type impurity into the second microcrystalline semiconductor film;
forming the second electrode adjacent to the second microcrystalline semiconductor film; and
heating at least the first microcrystalline semiconductor film and the second microcrystalline semiconductor film to obtain a first n-type microcrystalline semiconductor film and a second p-type microcrystalline semiconductor film.

2. A method for manufacturing a photoelectric conversion device by roll-to-roll system production means, said photoelectric conversion device including a unit cell or a plurality of unit cells connected to each other, said unit cell including a laminate over an organic resin substrate comprising:
a first electrode,
a photoelectric conversion layer, and
a second electrode,
said method comprising the steps of:
forming the first electrode over the organic resin substrate;
forming a first microcrystalline semiconductor film adjacent to the first electrode without adding n-type and p-type impurities;
forming a substantially intrinsic amorphous semiconductor film adjacent to the first microcrystalline semiconductor film;
forming a second microcrystalline semiconductor film adjacent to the substantially intrinsic amorphous semiconductor film without adding n-type and p-type impurities;
introducing a p-type impurity into the second microcrystalline semiconductor film and an interface between the second microcrystalline semiconductor film and the substantially intrinsic amorphous semiconductor film;
forming the second electrode adjacent to the second microcrystalline semiconductor film; and
heating at least the first microcrystalline semiconductor film and the second microcrystalline semiconductor film to obtain an n-type microcrystalline semiconductor film and a p-type microcrystalline semiconductor film.

3. A method according to claim 1, wherein a roll-to-roll system plasma CVD apparatus including a glow discharge plasma generating means is used in the steps of forming the first microcrystalline semiconductor film, the substantially intrinsic amorphous semiconductor film, and the second microcrystalline semiconductor film.

4. A method according to claim 1, wherein the steps of forming the first microcrystalline semiconductor film, the substantially intrinsic amorphous semiconductor film, and the second microcrystalline semiconductor film are carried out in a same reaction chamber.

5. A method for according to claim 1, wherein the steps of forming the first microcrystalline semiconductor film, the substantially intrinsic amorphous semiconductor film, and the second microcrystalline semiconductor film are carried out by using a same glow discharge plasma generating means in a same reaction chamber.

6. A method according to claim 1, wherein the steps of forming the first microcrystalline semiconductor film, the substantially intrinsic amorphous semiconductor film, and the second microcrystalline semiconductor film are carried out by using different glow discharge plasma generating means from each other in a same reaction chamber.

7. A method according to claim 1, wherein each of the first and second microcrystalline semiconductor films is a microcrystalline silicon film, and the substantially intrinsic amorphous semiconductor film is an amorphous silicon film.

8. A method according to claim 1, wherein each of the first and second microcrystalline semiconductor films is a microcrystalline silicon film, and the substantially intrinsic amorphous semiconductor film is an amorphous semiconductor film containing plural kinds of elements selected from the group consisting of carbon, silicon, germanium, and tin.

9. A method according to claim 1, wherein the p-type impurity is an element selected from the group consisting of B, Al, Ga, and In.

10. A method according to claim 1, wherein the p-type impurity is introduced from a surface of the second microcrystalline semiconductor film in the step of introducing the p-type impurity.

11. A method according to claim 1, wherein the p-type impurity is introduced from a surface of the second electrode formed adjacent to the second microcrystalline semiconductor film in the step of introducing the p-type impurity.

12. A method according to claim 1, wherein the p-type impurity is introduced by an ion doping method in the step of introducing the p-type impurity.

13. A method according to claim 12, wherein a dosage of the p-type impurity is in a range of from $2.0 \times 10^{13}/cm^2$ to $5.0 \times 10^{15}/cm^2$.

14. A method according to claim 1, wherein a temperature in the heating step is in a range of 150° C. to 450° C.

15. A method according to claim 1, wherein the organic resin substrate comprises at least one selected from the group consisting of polyethylene terephthalate, polyethylene naphthalate, polyether sulfone, polyimide, and aramid.

16. A method according to claim 1, wherein said photoelectric conversion device is a solar battery.

17. A method according to claim 1, wherein said photoelectric conversion device is an image sensor.

18. A method according to claim 1, wherein said photoelectric conversion device is a photosensor.

19. A method according to claim 2, wherein a roll-to-roll system plasma CVD apparatus, including a glow discharge plasma generating means is used in the steps of forming the first microcrystalline semiconductor film, the substantially intrinsic amorphous semiconductor film, and the second microcrystalline semiconductor film.

20. A method according to claim 2, wherein the steps of forming the first microcrystalline semiconductor film, the substantially intrinsic amorphous semiconductor film, and the second microcrystalline semiconductor film are carried out in a same reaction chamber.

21. A method for according to claim 2, wherein the steps of forming the first micro crystalline semiconductor film, the substantially intrinsic amorphous semiconductor film, and the second microcrystalline semiconductor film are carried out by using a same glow discharge plasma generating means in a same reaction chamber.

22. A method according to claim 2, wherein the steps of forming the first microcrystalline semiconductor film, the substantially intrinsic amorphous semiconductor film, and the second microcrystalline semiconductor film are carried out by using different glow discharge plasma generating means from each other in a same reaction chamber.

23. A method according to claim 2, wherein each of the first and second microcrystalline semiconductor films is a microcrystalline silicon film, and the substantially intrinsic amorphous semiconductor film is an amorphous silicon film.

24. A method according to claim 2, wherein each of the first and second microcrystalline semiconductor films is a microcrystalline silicon film, and the substantially intrinsic amorphous semiconductor film is an amorphous semiconductor film containing plural kinds of elements selected from the group consisting of carbon, silicon, germanium, and tin.

25. A method according to claim 2, wherein the p-type impurity is an element selected from the group consisting of B, Al, Ga, and In.

26. A method according to claim 2, wherein the p-type impurity is introduced from a surface of the second microcrystalline semiconductor film in the step of introducing the p-type impurity.

27. A method according to claim 2, wherein the p-type impurity is introduced from a surface of the second electrode formed adjacent to the second microcrystalline semiconductor film in the step of introducing-the p-type impurity.

28. A method according to claim 2, wherein the p-type impurity is introduced by an ion doping method in the step of introducing the p-type impurity.

29. A method according to claim 28, wherein a dosage of the p-type impurity is in a range of from $2.0 \times 10^{13}/cm^2$ to $5.0 \times 10^{15}/cm^2$.

30. A method according to claim 2, wherein a temperature in the heating step is in a range of 150° C. to 450° C.

31. A method according to claim 2, wherein the organic resin substrate comprises at least one selected from the group consisting of polyethylene terephthalate, polyethylene naphthalate, polyether sulfone, polyimide, and aramid.

32. A method according to claim 2, wherein said photoelectric conversion device is a solar battery.

33. A method according to claim 2, wherein said photoelectric conversion device is an image sensor.

34. A method according to claim 2, wherein said photoelectric conversion device is a photosensor.

35. A method for fabricating a device including semiconductor films, said method comprising:
providing a substrate in a chamber;
forming a first microcrystalline semiconductor film over a substrate;
forming an amorphous semiconductor film on the first microcrystalline semiconductor film;
forming a second microcrystalline semiconductor film on the amorphous semiconductor film;
providing a p-type impurity into the second microcrystalline semiconductor film,
wherein the first microcrystalline semiconductor film is an n-type semiconductor film,
wherein the forming steps of the first microcrystalline semiconductor film, the amorphous semiconductor film and the second microcrystalline semiconductor film are carried out in the same chamber,
wherein each of the first microcrystalline semiconductor film, the amorphous semiconductor film and the second microcrystalline semiconductor film is not provided with an n-type impurity and a p-type impurity before the providing step of the p-type impurity.

36. A method for fabricating a device including semiconductor films, said method comprising:
providing a substrate in a chamber;
forming a first microcrystalline semiconductor film over a substrate;
forming an amorphous semiconductor film on the first microcrystalline semiconductor film;

forming a second microcrystalline semiconductor film on the amorphous semiconductor film;

providing a p-type impurity into the second microcrystalline semiconductor film, wherein the first microcrystalline semiconductor film is an n-type semiconductor film, wherein the forming steps of the first microcrystalline semiconductor film, the amorphous semiconductor film and the second microcrystalline semiconductor film are carried out in the same chamber, wherein concentrations of an n-type impurity and a p-type impurity in the first microcrystalline semiconductor film, the amorphous semiconductor film and the second microcrystalline semiconductor film are same before the providing step of the p-type impurity.

* * * * *